(12) United States Patent
Hsieh et al.

(10) Patent No.: US 9,576,710 B2
(45) Date of Patent: Feb. 21, 2017

(54) MAGNETIC DEVICE AND METHOD OF MANUFACTURING THE SAME

(71) Applicants: Roger Hsieh, Hsinchu (TW); Cheng-Chang Lee, Yunlin County (TW); Chun-Tiao Liu, Hsinchu (TW); Yi-Min Huang, Hsinchu (TW); Chih-Siang Chuang, Hsinchu (TW)

(72) Inventors: Roger Hsieh, Hsinchu (TW); Cheng-Chang Lee, Yunlin County (TW); Chun-Tiao Liu, Hsinchu (TW); Yi-Min Huang, Hsinchu (TW); Chih-Siang Chuang, Hsinchu (TW)

(73) Assignee: CYNTEC CO., LTD., Hsinchu (TW)

( * ) Notice: Subject to any disclaimer, the term of this patent is extended or adjusted under 35 U.S.C. 154(b) by 5 days.

(21) Appl. No.: 14/820,558

(22) Filed: Aug. 7, 2015

(65) Prior Publication Data
US 2015/0348707 A1  Dec. 3, 2015

Related U.S. Application Data

(63) Continuation of application No. 13/902,997, filed on May 28, 2013, now Pat. No. 9,136,050.
(Continued)

(51) Int. Cl.
| | |
|---|---|
| *H01F 7/06* | (2006.01) |
| *H01F 5/00* | (2006.01) |
| *H01F 41/10* | (2006.01) |
| *H01F 41/02* | (2006.01) |
| *H01F 27/00* | (2006.01) |
| *H01F 17/04* | (2006.01) |
| *H01F 27/02* | (2006.01) |
| *H01F 27/29* | (2006.01) |
| *H05K 3/30* | (2006.01) |

(52) U.S. Cl.
CPC ............... *H01F 5/003* (2013.01); *H01F 5/00* (2013.01); *H01F 7/06* (2013.01); *H01F 17/04* (2013.01); *H01F 27/00* (2013.01); *H01F 27/022* (2013.01); *H01F 27/292* (2013.01); *H01F 41/0206* (2013.01); *H01F 41/10* (2013.01); *H05K 3/301* (2013.01); *Y10T 29/302* (2015.01); *Y10T 29/49073* (2015.01); *Y10T 29/49075* (2015.01)

(58) Field of Classification Search
CPC .................... H01F 27/00–27/30; H01F 7/06
USPC ............ 336/65, 83, 192, 200, 232; 29/602.1
See application file for complete search history.

(56) References Cited

U.S. PATENT DOCUMENTS

| | | | | |
|---|---|---|---|---|
| 4,314,221 | A | * | 2/1982 | Satou ....................... H01F 27/29 336/192 |
| 5,760,669 | A | * | 6/1998 | Dangler ................ H01F 17/043 336/192 |

(Continued)

*Primary Examiner* — Tuyen Nguyen
(74) *Attorney, Agent, or Firm* — Min-Lee Teng; Litron Patent & Trademark Office

(57) ABSTRACT

A magnetic device comprises a lead frame, a first core body and a coil. The lead frame has a first portion and a second portion spaced apart from the first portion. A first core body is disposed on the lead frame, wherein the first core body comprises a first through opening and a second through opening. A coil is disposed on the first core body, wherein the coil has a first terminal and a second terminal, wherein the first portion is electrically connected with the first terminal via the first through opening, and the second portion is electrically connected with the second terminal via the second through opening, respectively.

20 Claims, 12 Drawing Sheets

Related U.S. Application Data

(60) Provisional application No. 61/803,798, filed on Mar. 21, 2013.

(56) References Cited

U.S. PATENT DOCUMENTS 7,868,722 B2 * 1/2011 Hwang ................ H01F 17/062
    336/200
9,318,251 B2 * 4/2016 Klesyk ................ H01F 27/027

* cited by examiner form a lead frame having a first portion and a second portion spaced apart from the first portion.

dispose a first core body on the lead frame, wherein the first core body comprises a first through opening and a second through opening dispose a coil on the first core body, wherein the coil has a first terminal and a second terminal, wherein the first portion is electrically connected with the first terminal via the first through opening, and the second portion is electrically connected with the second terminal via the second through opening, respectively form a molding body to encapsulate the coil

FIG. 3

MAGNETIC DEVICE AND METHOD OF MANUFACTURING THE SAME

CROSS REFERENCE TO RELATED APPLICATIONS

This application is a continuation of U.S. patent application Ser. No. 13/902,997, filed May 28, 2013, which claims the benefit of priority of U.S. Provisional Application No. 61/803,798, filed Mar. 21, 2013. All of these applications are incorporated by referenced herein in their entirety.

BACKGROUND OF THE INVENTION

I. Field of the Invention

The present invention relates to a magnetic device and, in particular, to a magnetic device with electrodes made of a lead frame.

II. Description of the Prior Art

As an inductor has gradually become smaller and thinner, it is not easy to position the coil accurately which will affect product yield. The electrodes of the inductor are exposed to the lateral surface of the inductor so that a fixed space must be kept in the circuit board to prevent short circuit. Moreover, with the shrinkage of product size, a bad C-face crack will result from a bent stress when the electrodes of the inductor are bent during the molding process.

So far there are some drawbacks in the various types of inductors disclosed in the prior arts. In JP4795489B1, the design of the inductor which needs many electroplating steps induces a lot of process steps; the material capable of be electroplated is limited; and the electrodes of the inductor are exposed to the lateral surface of the inductor. In CN201207320Y, the conductive wires bent to the bottom of the iron core induce that the iron core doesn't have a smooth surface. If pressure is still applied in package process, the iron core easily has a crack.

Accordingly, the present invention proposes a magnetic device and a manufacturing method thereof to overcome the above-mentioned disadvantages.

SUMMARY OF THE INVENTION

One objective of the present invention is to provide a magnetic device with bottom electrodes made of a lead frame. The magnetic device comprises: a lead frame having a first portion and a second portion spaced apart from the first portion; a first core body disposed on the lead frame, wherein the first core body comprises a first through opening and a second through opening; and a coil disposed on the first core body, wherein the coil has a first terminal and a second terminal, wherein the first portion is electrically connected with the first terminal via the first through opening, and the second portion is electrically connected with the second terminal via the second through opening, respectively.

Preferably, the first portion comprises a first protrusion and the second portion comprises a second protrusion, wherein the first protrusion is connected with the first terminal through the first through opening, and the second protrusion is connected with the second terminal through the second through opening, respectively. A first conductive pillar can be disposed in the first through opening to connect the first portion with the first terminal, and a second conductive pillar can be disposed in the second through opening to connect the second portion with the second terminal, respectively.

A molding body encapsulates the coil. A first electrode is disposed on the bottom surface of the first portion and a second electrode is disposed on the bottom surface of the second portion. That is, the bottom of each of the first portion and the second portion of the lead frame is exposed to the bottom of the molding body such that the first portion and the second portion respectively serve as a first electrode and a second electrode of the magnetic device. The main advantages of the magnetic device in the present invention are described as follows: 1. Adhesion area between the bottom electrodes of the magnetic device and the circuit board is maximized to enhance the adhesion strength. 2. Because of no lateral electrode, product size can be shrunk and surface utility rate of the circuit board can be raised. 3. The height and the shape of the protrusions of the lead frame can be adjusted to be adapted for various types of coils so that it is easier to weld and position the core body. 4. The lead frame can be formed by various methods, such as folding, bending, electroplating or etching.

Another objective of the present invention is to provide a method for forming a magnetic device. The method comprises the steps of: forming a lead frame having a first portion and a second portion spaced apart from the first portion; disposing a first core body on the lead frame, wherein the first core body comprises a first through opening and a second through opening; and disposing a coil on the first core body, wherein the coil has a first terminal and a second terminal, wherein the first portion is electrically connected with the first terminal via the first through opening, and the second portion is electrically connected with the second terminal via the second through opening, respectively. In one embodiment of the magnetic device adapted for SMD technology, the lead frame can be formed by electroplating or etching.

Another objective of the present invention is to provide a method for forming a magnetic device, the method comprising the steps of: forming a lead frame comprising a first bottom part and a first protrusion connected to the first bottom part; forming a first core body, wherein the first core body comprises a first through opening; placing the first core body on the first bottom part of the lead frame, with at least a part of the first protrusion of the lead frame disposed in the first through opening for electrically connecting with a first terminal of a coil on the first core body; and encapsulating the first protrusion of the lead frame and the coil by using a molding material.

In one embodiment, the first bottom part and the first protrusion are integrally formed.

In one embodiment, the lead frame further comprises a second bottom part and a second protrusion connected to the second bottom part, and wherein the first core body further comprises a second through opening, wherein the first core body is placed on the first bottom part of the lead frame and at least a part of the second protrusion of the lead frame is disposed in the second through opening for electrically connecting with a second terminal of the coil on the first core body.

In one embodiment, the first bottom part and the first protrusion are integrally formed, and the second bottom part and the second protrusion are integrally formed.

In one embodiment, the lead frame is formed by electroplating a conductive pillar on a conductive material.

In one embodiment, the lead frame is formed by electroplating a conductive pillar on a copper foil.

In one embodiment, the lead frame is formed by etching a metallic substrate.

In one embodiment, the first protrusion comprises a first foldable soldering pad.

In one embodiment, the first protrusion comprises a first bent portion for connecting with the first terminal.

In one embodiment, the first through opening is formed with a first outer side surface of the first core body.

In one embodiment, the first through opening is formed with two outer side surfaces of the first core body.

In one embodiment, the first through opening is formed with a first outer side surface of the first core body; and the second through opening is formed with a second outer side surface of the first core body.

In one embodiment, the first through opening and the second through opening are respectively formed with two outer side surfaces of the first core body.

In one embodiment, the first through opening and the second through opening are respectively formed on a periphery of the first core body, wherein the first protrusion is not extended outside of any outer side surface of the first core body adjacent to the first through opening, and the second protrusion is not extended outside of any outer side surface of the first core body adjacent to the second through opening.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 3 is the process flow of manufacturing a magnetic device in FIG. 1A, FIG. 1E, FIG. 2C and FIG. 4A;

DETAILED DESCRIPTION OF THE INVENTION

The detailed explanation of the present invention is described as following. The described preferred embodiments are presented for purposes of illustrations and description and they are not intended to limit the scope of the present invention.

The present invention discloses a magnetic device in which a first portion and a second portion of a lead frame respectively are electrically connected with a first terminal and a second terminal of a coil through a first through opening and a second through opening of a core body to serve as a first electrode and a second electrode on the bottom of the magnetic device.

Figure 1A:
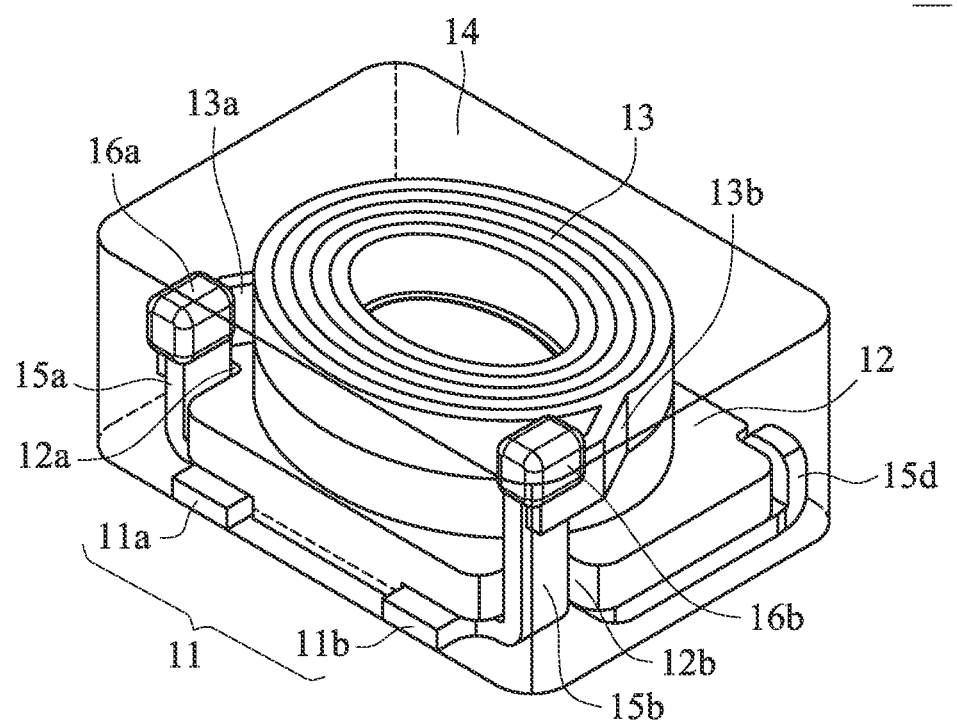
FIG. 1A is a schematic view of a magnetic device in the present invention.
Figure 1B:
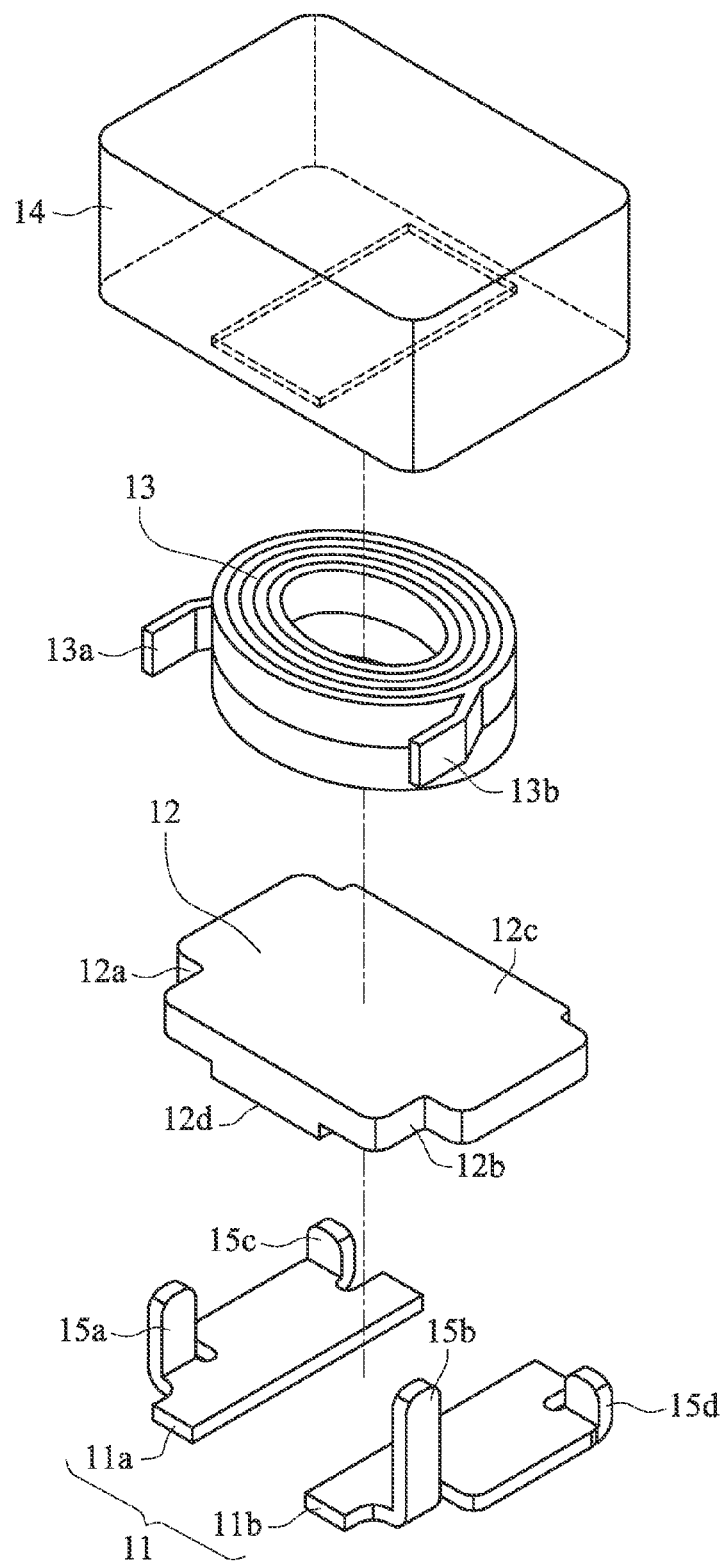
FIG. 1B is an exploded schematic view of the magnetic device shown in FIG. 1A.
Figure 1C:
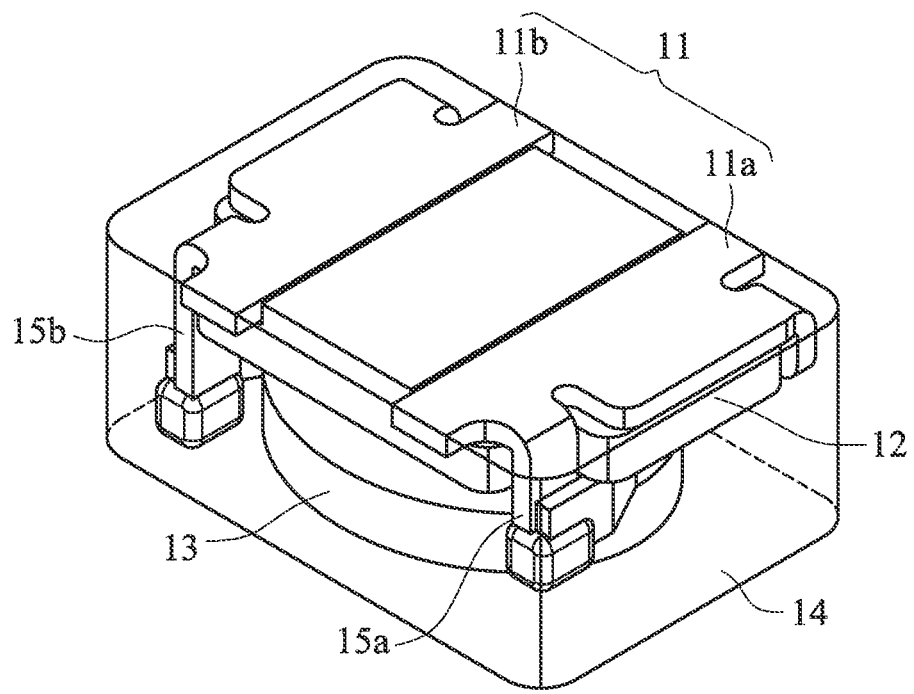
FIG. 1C is a bottom schematic view of the magnetic device shown in FIG. 1A.
Figure 1D:
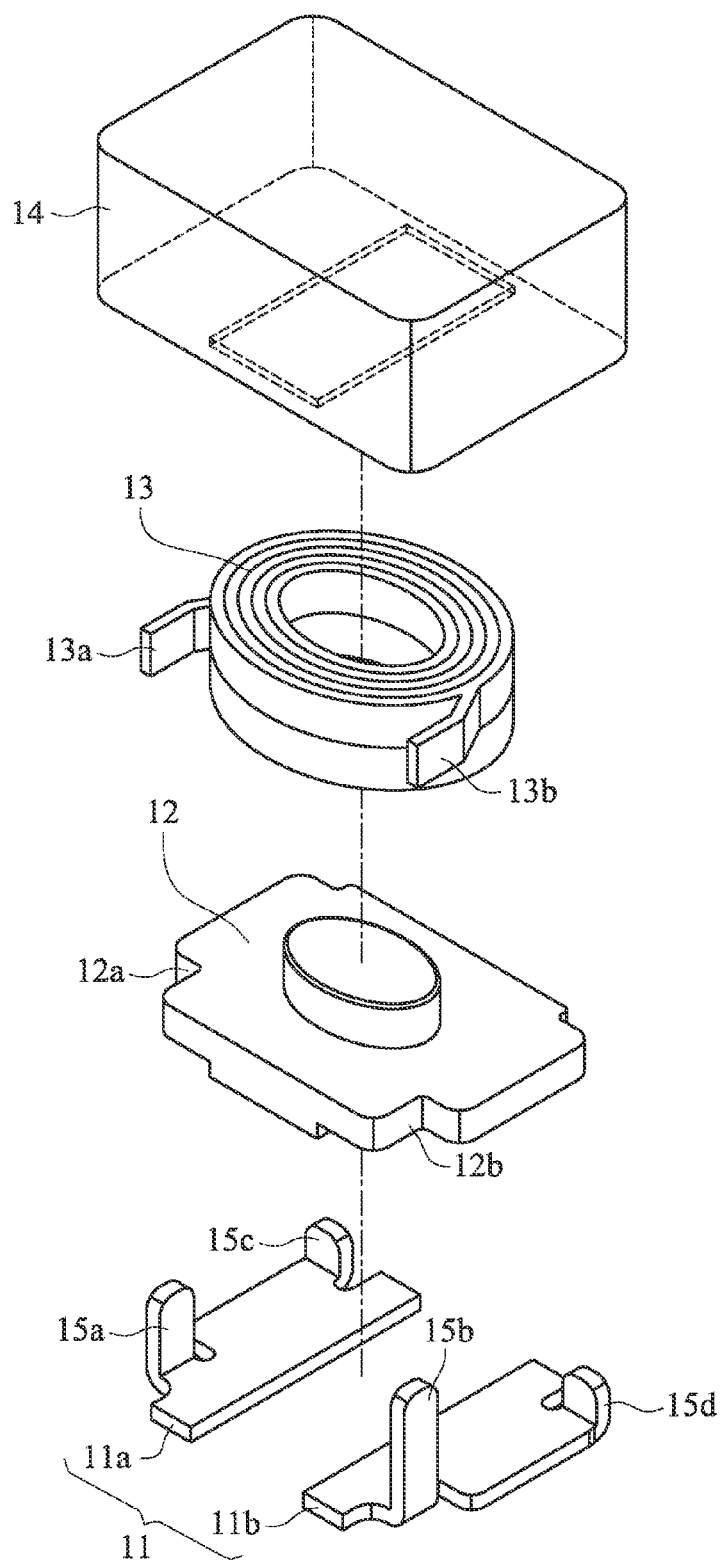
FIG. 1D is an exploded schematic view of the magnetic device, wherein the first core body is a T-core body.
Figure 1E:
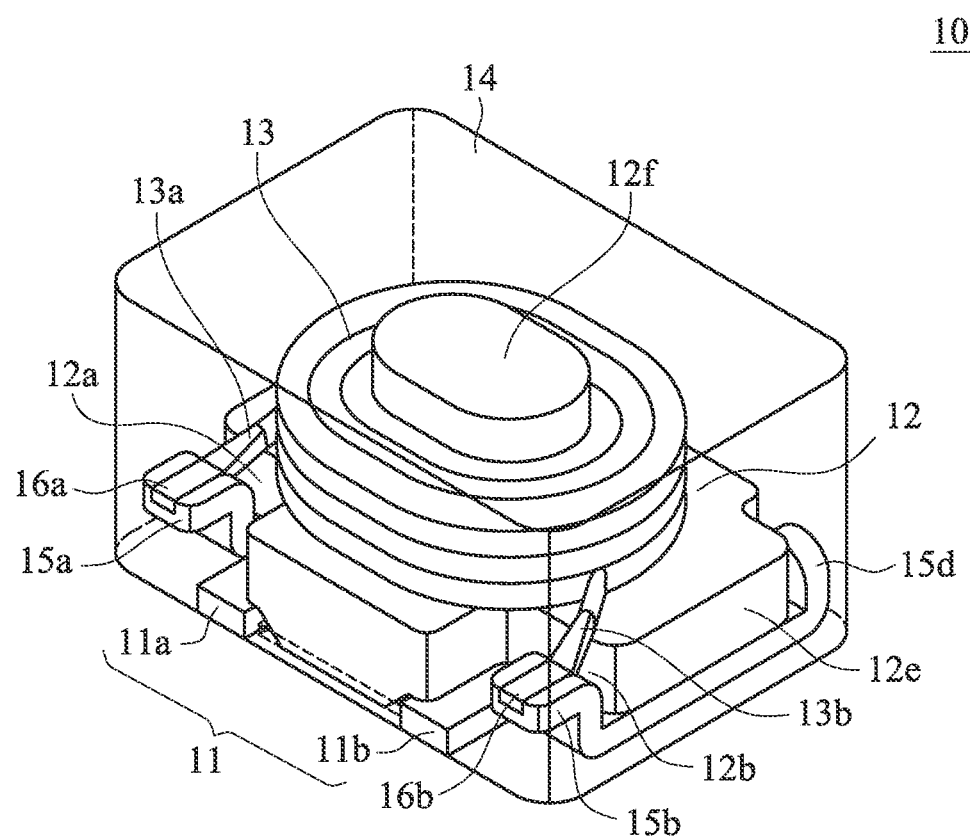
FIG. 1E is a schematic view of the magnetic device in the present invention, wherein the first core body is a T-core body.

FIG. 1A is a schematic view of a magnetic device 10 in the present invention. FIG. 1B is an exploded schematic view of the magnetic device 10 shown in FIG. 1A. FIG. 1C is a bottom schematic view of the magnetic device 10 shown in FIG. 1A. FIG. 1D is an exploded schematic view of the magnetic device 10, wherein the first core body is a T-core body. FIG. 1E is a schematic view of the magnetic device 10 in the present invention, wherein the first core body is a T-core body. The magnetic device 10 includes a lead frame 11, a first core body 12, a coil 13 and a molding body 14.

Figure 2A:
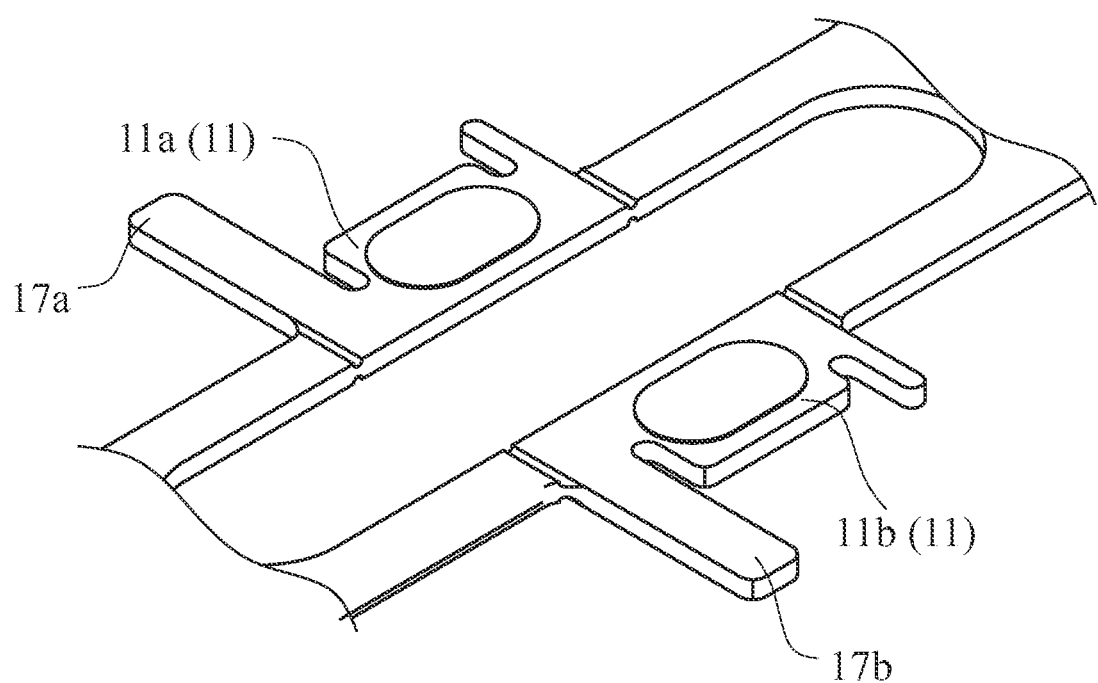
FIG. 2A is a schematic view of a foldable lead frame, wherein the foldable lead frame is unfolded.
Figure 2B:
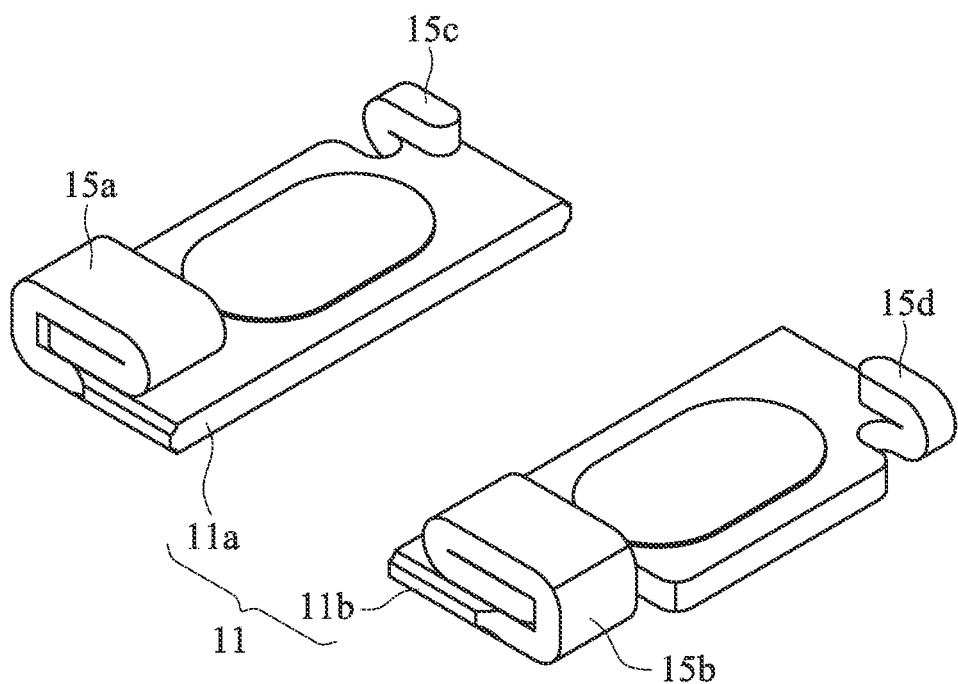
FIG. 2B is a schematic view of a foldable lead frame.
Figure 2C:
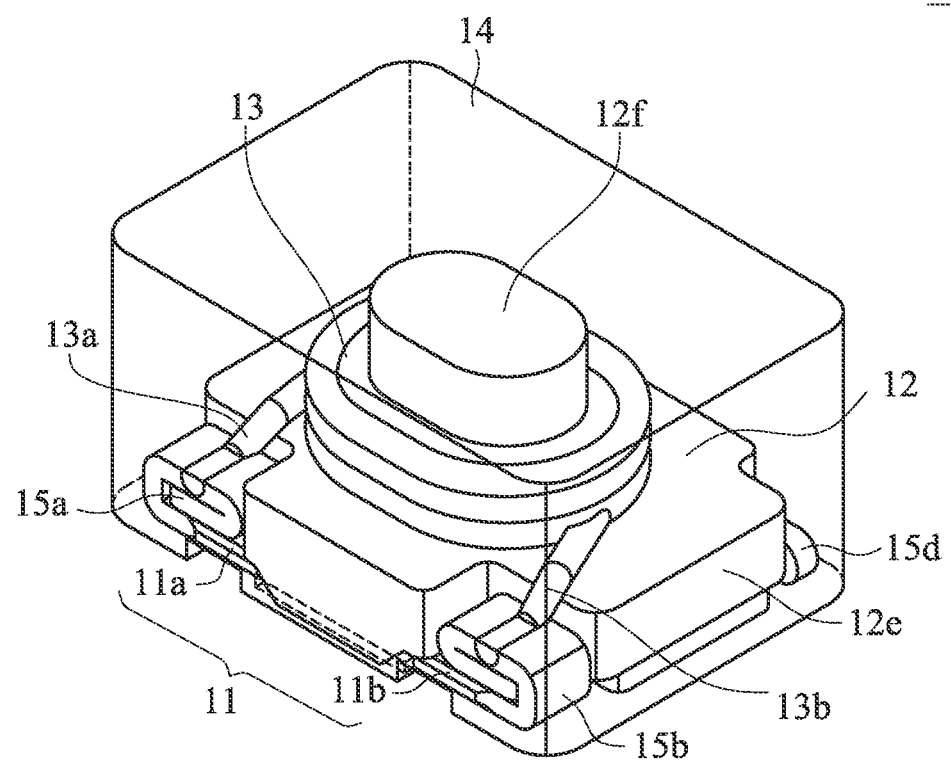
FIG. 2C is a schematic view of a magnetic device in the present invention, wherein the lead frame is foldable.
Figure 2D:
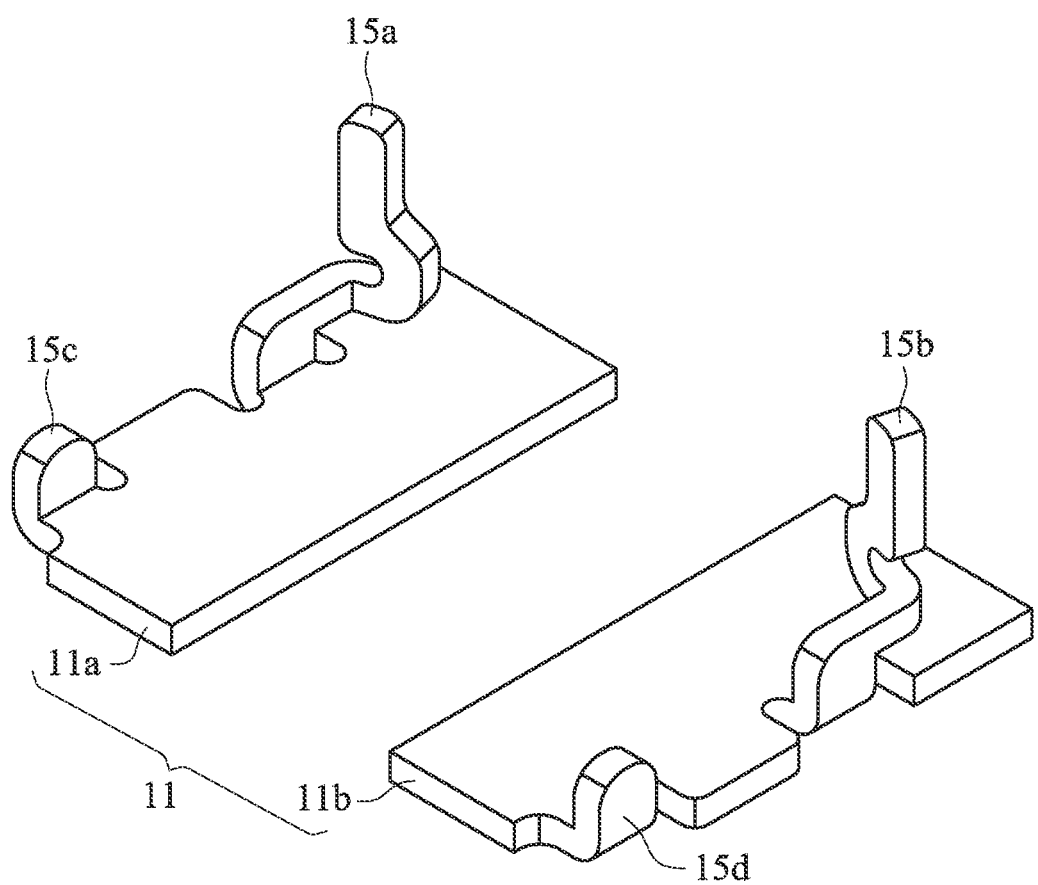
FIG. 2D is a schematic view of a bent lead frame.

The lead frame 11 has a first portion 11a and a second portion 11b spaced apart from the first portion 11a. Optionally, the first portion 11a can comprise a first protrusion 15a, and the second portion 11b can comprise a second protrusion 15b. For a better electrical connection between the lead frame 11 and the coil 13, the top of the first protrusion 15a is higher than that of the first through opening 12a, and the top of the second protrusion 15b is higher than that of the second through opening 12b. Preferably, the first portion 11a further comprises a third protrusion 15c, and the second portion 11b further comprises a fourth protrusion 15d, wherein the first protrusion 15a, the second protrusion 15b, the third protrusion 15c and the fourth protrusion 15d surround the first core body 12. In one embodiment (see FIG. 2A, FIG. 2B and FIG. 2C), the first protrusion 15a comprises a first foldable soldering pad 17a, and the second protrusion 15b comprises a second foldable soldering pad 17b. Specifically speaking, the first portion 11a of the lead frame 11 has a first foldable soldering pad 17a folded to serve as the first protrusion 15a, and the second portion 11b of the lead frame 11 has a second foldable soldering pad 17b folded to serve as the second protrusion 15b. In another embodiment (see FIG. 2D), the first protrusion 15a comprises a first bent portion for connecting with a first terminal of a coil, and the second protrusion 15b comprises a second bent portion for connecting with the second terminal of a coil. For example, the first protrusion 15a, the second protrusion 15b, the third protrusion 15c, the fourth protrusion 15d can be formed by bending four segments of a flat lead frame 11. Moreover, the lead frame 11 can be also formed by electroplating or etching (described hereafter).

A first core body 12 is disposed on the lead frame 11. The first core body 12 is a magnetic core body. The first core body 12 can be made of any suitable magnetic powder, such as Fe alloy powder (Fe—Cr—Si, Fe—Al—Cr or Fe—Si—Al), ferrite powder (Ni—Zn ferrite or Mn—Zn ferrite), amorphous alloy powder or Fe powder. By pressing-molding process (e.g., heating or sintering), the magnetic powder and adhesive are mixed to form the first core body 12. The first core body 12 can have any suitable shape according design or practical application.

The first core body 12 comprises a first through opening 12a and a second through opening 12b. There are many different ways to locate the first through opening 12a and the second through opening 12b: in one embodiment, each of the first through opening 12a and the second through opening 12b is formed inside the first core body 12; in another embodiment, each of the first through opening 12a and the second through opening 12b is formed with one side of the opening aligned with one edge of the first core body 12; and in yet another embodiment, each of the first through opening 12a and the second through opening 12b is formed with two sides of the opening aligned with two edges of the first core body 12 respectively.

A coil 13 is disposed on the first core body 12. The coil 13 can be formed by wrapping round-wire, flat-wire or enameled-wire made of Cu or Ag. The coil 13 can be made of a conductive wire or a conductive pattern formed by any known technology, such as electroplating, etching, printing process or film process. The coil 13 has a first terminal 13a and a second terminal 13b. The first portion 11a is electrically connected with the first terminal 13a via the first through opening 12a, and the second portion 15b is electrically connected with the second terminal 13b via the second through opening 12b, respectively. Preferably, the first portion 11a comprises a first protrusion 15a and the second portion 11b comprises a second protrusion 15b, wherein the first protrusion 15a is connected with the first terminal 13a through the first through opening 12a, and the second protrusion 15b is connected with the second terminal 13b through the second through opening 12b, respectively. In one embodiment, the top end of the first protrusion 15a can be disposed in the first through opening 12a, and the top end of the second protrusion 15b can be disposed in the second through opening 12b. In other words, refer to FIG. 1E and FIG. 4A, the first joined point 16a of the first terminal 13a and the first protrusion 15a can be inside the first through opening 12a, and the second joined point 16b of the second terminal 13b and the second protrusion 15b can be inside the second through opening 12b. In another embodiment, at least one portion of the first protrusion 15a is disposed outside the first through opening 12a, and at least one portion of the second protrusion 15b is disposed outside the second through opening 12b. In other words, refer to FIG. 1A, the first joined point 16a of the first terminal 13a and the first protrusion 15a is substantially higher than the top of the first through opening 12a, and the second joined point 16b of the second terminal 13b and the second protrusion 15b is substantially higher than the top of the second through opening 12b.

A first conductive pillar (not shown) can be disposed in the first through opening 12a to connect the first portion 11a with the first terminal 13a, and a second conductive pillar (not shown) can be disposed in the second through opening 12b to connect the second portion 11b with the second terminal 13b, respectively. It has been disclosed in U.S. patent application Ser. No. 13/179,884, filed Jul. 11, 2011.

There are many different ways to dispose the coil 13 on the first core body 12. In one embodiment (see FIG. 1A and FIG. 1B), the first core boy 12 has a first surface 12c which is substantially flat, wherein the coil 13 is disposed on the first surface 12c of the first core body 12. In another embodiment (see FIG. 1E, FIG. 2C and FIG. 4A), the first core boy 12 (e.g., T-core) comprises a plate 12e and a pillar 12f having a top end and a bottom end, wherein the bottom end of the pillar 12f is connected to the plate 12e, wherein the coil 13 is disposed on the plate 12e and winded around the pillar 12f. In one embodiment, the magnetic device 10 further comprises a second core body (not shown), wherein the coil 13 is disposed between the first core body 12 and the second core body. The material of the first core body 12 can be the same as that of the second core body or different from that of the second core body.

The second core body is a magnetic core body. The second core body can be made of any suitable magnetic powder, such as Fe alloy powder (Fe—Cr—Si, Fe—Al—Cr or Fe—Si—Al), ferrite powder (Ni—Zn ferrite or Mn—Zn ferrite), amorphous alloy powder or Fe powder. By pressing-molding process (e.g., heating or sintering), the magnetic powder and adhesive are mixed to form the second core body. The second core body can have any suitable shape according design or practical application.

A molding body 14 encapsulates the coil 13. A first electrode is disposed on the bottom surface of the first portion 11a and a second electrode is disposed on the bottom surface of the second portion 11b. That is, the bottom of each of the first portion 11a and the second portion 11b of the lead frame 11 is exposed to the bottom of the molding body 14 such that the first portion 11a and the second portion respectively 11b serve as a first electrode and a second electrode of the magnetic device 10. The first electrode and the second electrode of the magnetic device 10 can be formed by printing or electroplating.

FIG. 3 is the process flow of manufacturing a magnetic device 10, 20, 30 in FIG. 1A, FIG. 1E, FIG. 2C and FIG. 4A.

In step 31, form a lead frame 11 having a first portion 11a and a second portion 11b spaced apart from the first portion 11a. Optionally, the first portion 11a can comprise a first protrusion 15a and the second portion 11b can comprise a second protrusion 15b.

Figure 4A:
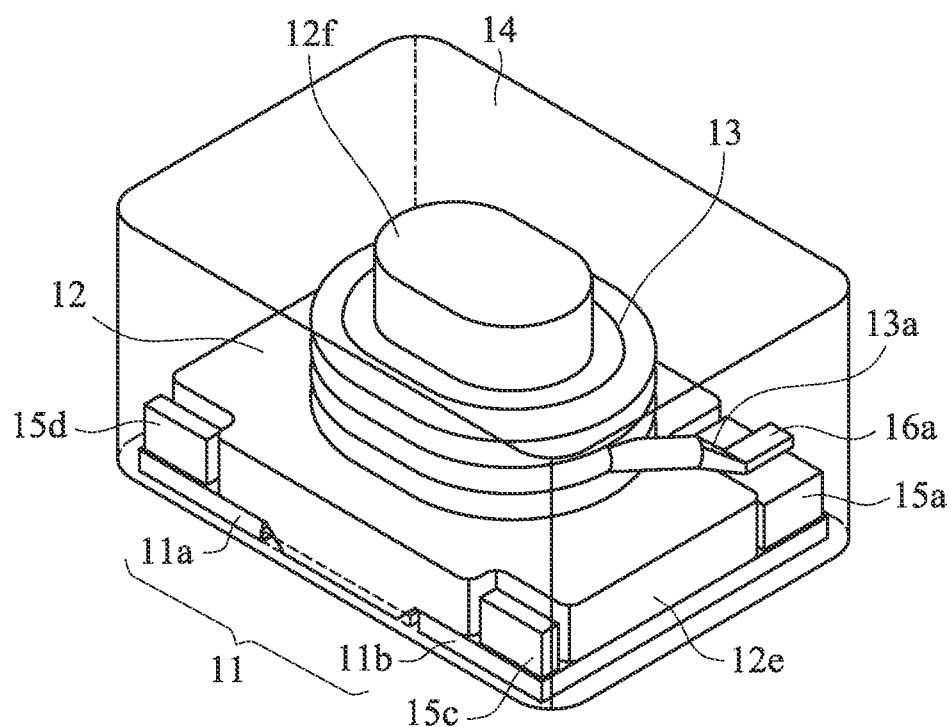
FIG. 4A is a schematic view of a magnetic device in the present invention, wherein the lead frame is formed by electroplating or etching.
Figure 4B:
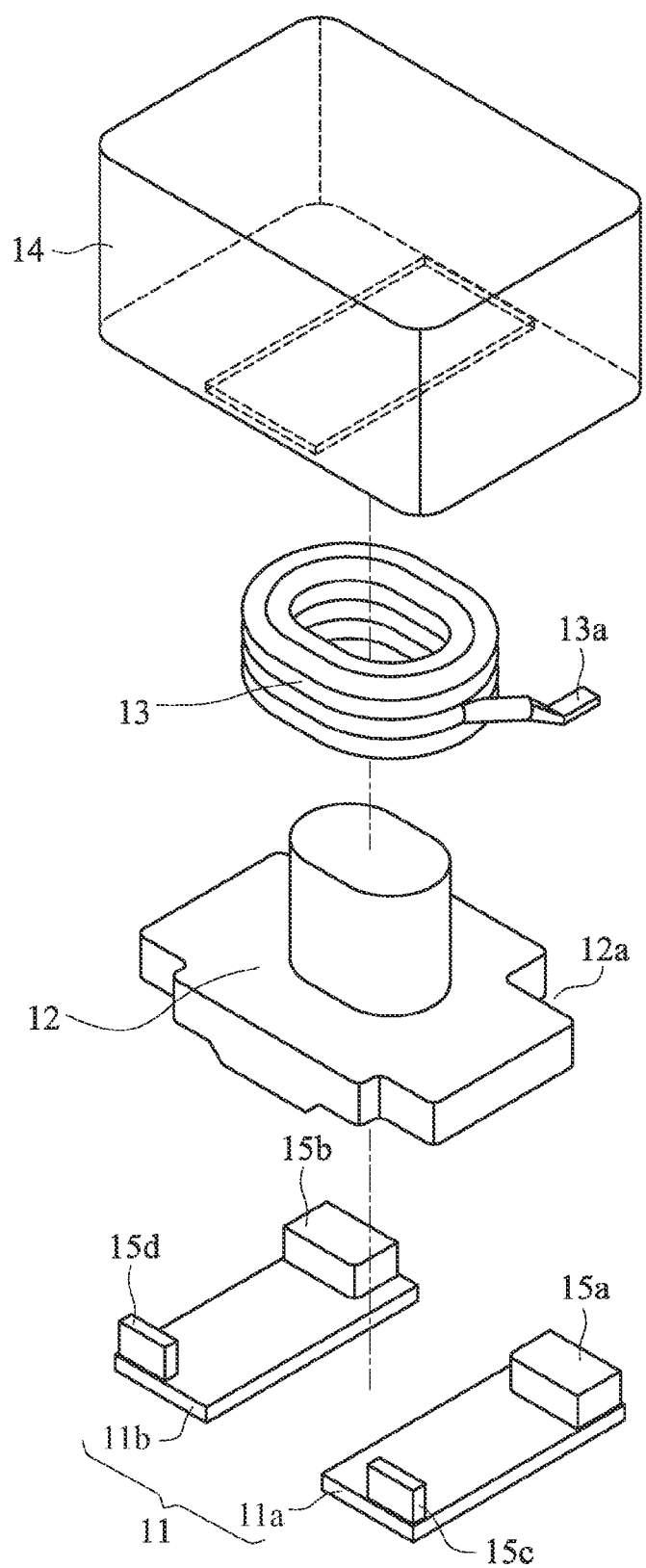
FIG. 4B is an exploded schematic view of the magnetic device shown in FIG. 4A.

In one embodiment of the magnetic device adapted for SMD technology, the lead frame can be formed by electroplating or etching. FIG. 4A is a schematic view of a magnetic device 30 in the present invention, wherein the lead frame 11 is formed by electroplating or etching. FIG. 4B is an exploded schematic view of the magnetic device 30 shown in FIG. 4A. To form the lead frame 11, for example, Sn or Ni/Sn can be electroplated on a conductive material (e.g., copper foil) which can be made of Cu, or a conductive material (e.g., a metallic substrate) can be etched. In this case, each of the first protrusion 15a and the second protrusion 15b is a conductive pillar. The advantages are listed as below: 1. The magnetic device has a complete electrode plane, and the plane shape can be adjusted according to design demand. Compared to the lead frame formed by bending, the bottom electrodes of the magnetic device are complete, and adhesion area between the bottom electrodes of the magnetic device and the circuit board is maximized (utility rate of electrode area is larger than 90%) to enhance the adhesion strength. 2. The height and the shape of the protrusive conductive pillars can be adjusted to be adapted for various types of coils so that it is easier to weld and position the core body. 3. The design of the bottom electrodes of the magnetic device can reduce the distance between devices on the circuit board. 4. The lead frame can be directly adapted for SMD technology, so the electroplating steps in the process of the magnetic device can be saved and the material capable of be electroplated is not limited.

In step 32, dispose a first core body 12 on the lead frame 11, wherein the first core body 12 comprises a first through opening 12a and a second through opening 12b. In one embodiment, the magnetic device further comprises a second core body (not shown), wherein the coil is disposed between the first core body 12 and the second core body. The first core body 12 (or the second core body) is a magnetic core body. The material of the first core body 12 can be the same as that of the second core body or different from that of the second core body. The first core body 12 (or the second core body) can be formed by hot-pressing molding or cold-pressing molding, preferably, cold-pressing molding.

In step 33, dispose a coil 13 on the first core body 12, wherein the coil 13 has a first terminal 13a and a second terminal 13b, wherein the first portion 11a is electrically connected with the first terminal 13a via the first through opening 12a, and the second portion 11b is electrically connected with the second terminal 13b via the second through opening 12b, respectively. Preferably, the first portion 11a comprises a first protrusion 15a and the second portion 11b comprises a second protrusion 15b, wherein the first protrusion 15a is connected with the first terminal 13a through the first through opening 12a, and the second protrusion 15b is connected with the second terminal 13b through the second through opening 12b, respectively. A first conductive pillar (not shown) can be disposed in the first through opening 12a to connect the first portion 11a with the first terminal 13a, and a second conductive pillar (not shown) can be disposed in the second through opening 12b to connect the second portion 11b with the second terminal 13b, respectively. The coil 13 can be formed by wrapping round-wire, flat-wire or enameled-wire made of Cu or Ag. The coil 13 can be made of a conductive wire or a conductive pattern formed by any known technology, such as electroplating, etching, printing process or film process.

In step 34, form a molding body 14 to encapsulate the coil 13. The molding body 14 can be formed by hot-pressing molding or cold-pressing molding, preferably, hot-pressing molding. A first electrode is disposed on the bottom surface of the first portion 11a and a second electrode is disposed on the bottom surface of the second portion 11b. That is, the bottom of each of the first portion 11a and the second portion 11b of the lead frame 11 is exposed to the bottom of the molding body 14 such that the first portion 11a and the second portion 11b respectively serve as a first electrode and a second electrode of the magnetic device. The first electrode and the second electrode of the magnetic device can be formed by printing or electroplating.

Detailed process is listed as below. A lead frame is formed by punching, electroplating or etching, and then the lead frame is dispensed. A core body is formed by cold-pressing molding and connected to the lead frame. The coil is disposed on the core body, and the terminals of the coil are electrically connected to the protrusions of the lead frame by spot welding or laser welding plus wire-head trimming. A molding body is formed to encapsulate the coil by hot-pressing molding and curing. The electrodes of the magnetic device are formed by electroplating or printing. Finally, the final product is done by trimming and passing electrical testing.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for forming a magnetic device, the method comprising the steps of:
    forming a lead frame comprising a first bottom part and a first protrusion connected to the first bottom part;
    forming a first core body, wherein the first core body comprises a first through opening;
    placing the first core body on the first bottom part of the lead frame, with at least a part of the first protrusion of the lead frame disposed in the first through opening for electrically connecting with a first terminal of a coil on the first core body; and
    encapsulating the first protrusion of the lead frame and the coil by using a molding material.

2. The method according to claim 1, wherein the first bottom part and the first protrusion are integrally formed.

3. The method according to claim 1, wherein the lead frame further comprises a second bottom part and a second protrusion connected to the second bottom part, and wherein the first core body further comprises a second through opening, wherein the first core body is placed on the first bottom part of the lead frame and at least a part of the second protrusion of the lead frame is disposed in the second through opening for electrically connecting with a second terminal of the coil on the first core body.

4. The method according to claim 3, wherein the first bottom part and the first protrusion are integrally formed, and the second bottom part and the second protrusion are integrally formed.

5. The method according to claim 1, wherein the lead frame is formed by electroplating a conductive pillar on a conductive material.

6. The method according to claim 1, wherein the lead frame is formed by electroplating a conductive pillar on a copper foil.

7. The method according to claim 1, wherein the lead frame is formed by etching a metallic substrate.

8. The method according to claim 2, wherein the first protrusion comprises a first foldable soldering pad.

9. The method according to claim 2, wherein the first protrusion comprises a first bent portion for connecting with the first terminal.

10. The method according to claim 1, wherein the first through opening is formed with a first outer side surface of the first core body.

11. The method according to claim 1, wherein the first through opening is formed with two outer side surfaces of the first core body.

12. The method according to claim 1, further comprising a second core body, wherein the coil is disposed between the first core body and the second core body.

13. The method according to claim 1, wherein the first core boy has a first surface which is substantially flat, wherein the coil is disposed on the first surface of the first core body.

14. The method according to claim 3, wherein the first core boy comprises a plate and a pillar having a top end and a bottom end, wherein the bottom end of the pillar is connected to the plate, wherein the coil is disposed on the plate and wound around the pillar, wherein the molding material encapsulates the coil, the first protrusion, the second protrusion and a top portion of the pillar.

15. The method according to claim 3, wherein a first electrode is formed on the first bottom part of the lead frame, and a second electrode is formed on the second bottom part of the lead frame.

16. The method according to claim 3, wherein the top end of the first protrusion is disposed in the first through opening, and the top end of the second protrusion is disposed in the second through opening.

17. The method according to claim 3, wherein at least one portion of the first protrusion is disposed outside the first through opening, and at least one portion of the second protrusion is disposed outside the second through opening.

18. The method according to claim 3, wherein the first through opening is formed with a first outer side surface of the first core body; and the second through opening is formed with a second outer side surface of the first core body.

19. The method according to claim 3, wherein the first through opening and the second through opening are respectively formed with two outer side surfaces of the first core body.

20. The method according to claim 3, wherein the first through opening and the second through opening are respectively formed on a periphery of the first core body, wherein the first protrusion is not extended outside of any outer side surface of the first core body adjacent to the first through opening, and the second protrusion is not extended outside of any outer side surface of the first core body adjacent to the second through opening.

* * * * *